United States Patent
Forster et al.

(10) Patent No.: US 7,295,117 B2
(45) Date of Patent: Nov. 13, 2007

(54) RFID DEVICE TEST THRESHOLDS SYSTEMS AND METHODS

(75) Inventors: Ian J. Forster, Chelmsford (GB); Thomas C. Weakley, Simpsonville, SC (US)

(73) Assignee: Avery Dennison, Pasadena, CA (US)

(*) Notice: Subject to any disclaimer, the term of this patent is extended or adjusted under 35 U.S.C. 154(b) by 153 days.

(21) Appl. No.: 11/101,352

(22) Filed: Apr. 7, 2005

(65) Prior Publication Data

US 2006/0226983 A1  Oct. 12, 2006

(51) Int. Cl.
*G08B 13/14* (2006.01)
(52) U.S. Cl. .................. 340/572.1; 340/10.3
(58) Field of Classification Search ............ 340/572.1, 340/572.5, 10.6, 10.3, 10.1, 572.7; 324/667, 324/765; 714/733; 198/346.2
See application file for complete search history.

(56) References Cited

U.S. PATENT DOCUMENTS

| | | | |
|---|---|---|---|
| 4,802,216 A | 1/1989 | Irwin et al. | |
| 5,983,363 A | 11/1999 | Tuttle et al. | |
| 6,104,291 A | 8/2000 | Beauvillier et al. | |
| 6,202,824 B1 * | 3/2001 | Goss et al. | 198/346.2 |
| 6,219,543 B1 | 4/2001 | Myers et al. | |
| 6,236,223 B1 * | 5/2001 | Brady et al. | 324/765 |
| 6,246,326 B1 | 6/2001 | Wiklof et al. | |
| 6,346,881 B1 | 2/2002 | Davidson | |
| 6,409,401 B1 | 6/2002 | Petteruti et al. | |
| 6,412,086 B1 * | 6/2002 | Friedman et al. | 714/733 |
| 6,445,297 B1 | 9/2002 | Nicholson | |
| 6,486,769 B1 | 11/2002 | McLean | |
| 6,487,681 B1 | 11/2002 | Tuttle et al. | |
| 6,545,605 B2 | 4/2003 | Von Horn et al. | |
| 6,593,853 B1 | 7/2003 | Barrett et al. | |
| 6,784,789 B2 | 8/2004 | Eroglu et al. | |
| 6,806,812 B1 | 10/2004 | Cathey | |
| 7,132,946 B2 | 11/2006 | Waldner et al. | |
| 2001/0002106 A1 | 5/2001 | Tuttle et al. | |
| 2002/0167397 A1 | 11/2002 | Eroglu et al. | |
| 2002/0186004 A1 | 12/2002 | Prazeres da Costa | |
| 2004/0032443 A1 | 2/2004 | Moylan et al. | |
| 2004/0075607 A1 | 4/2004 | Cathey | |
| 2004/0160233 A1 | 8/2004 | Forster | |
| 2004/0178267 A1 | 9/2004 | Tsirline et al. | |
| 2004/0215350 A1 | 10/2004 | Roesner | |
| 2005/0045723 A1 | 3/2005 | Tsirline et al. | |
| 2005/0045724 A1 | 3/2005 | Tsirline et al. | |

(Continued)

FOREIGN PATENT DOCUMENTS

JP      2003/076946      3/2003

(Continued)

*Primary Examiner*—Brent A. Swarthout
(74) *Attorney, Agent, or Firm*—MacPherson Kwok Chen & Heid LLP; Greg J. Michelson

(57) ABSTRACT

Systems and methods are disclosed herein to provide RFID device test techniques. For example, in accordance with an embodiment of the present invention, a radio frequency identification (RFID) device test system includes an RFID device tester adapted to test RFID devices that are disposed in a closely spaced configuration. The RFID device tester applies a variable threshold, to each of the RFID devices tested, based on characteristics of at least one of the RFID devices neighboring the RFID device being tested.

20 Claims, 2 Drawing Sheets

U.S. PATENT DOCUMENTS

| | | |
|---|---|---|
| 2005/0068179 A1 | 3/2005 | Roesner |
| 2005/0150102 A1 | 7/2005 | Bosco et al. |
| 2006/0012387 A1 | 1/2006 | Shanks |

FOREIGN PATENT DOCUMENTS

| | | |
|---|---|---|
| JP | 2003/076947 | 3/2003 |
| JP | 2003/099719 | 4/2003 |
| JP | 2003/099720 | 4/2003 |
| JP | 2003/099721 | 4/2003 |
| JP | 2003/168082 | 6/2003 |
| JP | 2003/168098 | 6/2003 |
| JP | 2003/187213 | 7/2003 |
| JP | 2003/331220 | 11/2003 |
| WO | WO 00/28339 | 5/2000 |
| WO | WO 01/65517 | 9/2001 |
| WO | WO 01/67413 | 9/2001 |
| WO | WO 02/14884 | 2/2002 |
| WO | WO 02/088762 | 11/2002 |
| WO | WO 2004/084119 | 9/2004 |
| WO | WO 2004/088571 | 10/2004 |
| WO | WO 2004/095350 | 11/2004 |

* cited by examiner

RFID DEVICE TEST THRESHOLDS SYSTEMS AND METHODS

TECHNICAL FIELD

The present invention relates generally to radio frequency identification (RFID) applications and, more particularly, to RFID device testing.

BACKGROUND

Radio frequency identification (RFID) devices are well known and are increasingly utilized in a wide variety of applications. However, one challenge associated with RFID devices (e.g., RFID tags, RFID labels, RFID chips, RFID straps, or RFID inlays) is the manufacture and testing of the RFID devices in a high-volume and cost-effective manner.

For example, during or after the manufacturing process, the RFID devices may be tested while located in close proximity to each other (e.g., adjacent RFID devices closely spaced). The RFID devices, as an example, may be manufactured on a common carrier web, with the RFID device (e.g., an RFID inlay) having its antenna mounted on the common carrier web and its integrated circuit mounted to the antenna.

Due to the close proximity of the RFID devices, it may be difficult to establish bi-directional communication with each of the RFID devices during testing. In general, an antenna of the RFID device may be viewed as having a near field region and a far field region. The near field region refers to a reactive near field (e.g., approximately $R \leq \lambda/2\pi$) and a radiating near field (e.g., approximately $R < 2D^2/\lambda$), while the far field region refers to a radiating far-field component (e.g., $R > 2D^2/\lambda$), where R is the distance from the antenna and D is the largest dimension of the antenna. Short-range testing of RFID devices generally involves testing within the near field region (e.g., utilizing the near or far-field components), while long-range testing generally involves testing within the far field region.

For short-range testing and long-range testing, typically certain precautions must be taken, when testing one of the RFID devices, to prevent the RFID devices that are in close proximity from also responding or affecting the test results for each RFID device being tested. This results in complicated test procedures or test setups and may lead to operational RFID devices that are tested and erroneously determined to be defective. As a result, there is a need for improved test techniques for RFID devices.

SUMMARY

Systems and methods are disclosed herein to provide RFID device test techniques. For example, in accordance with an embodiment of the present invention, an RFID test system is disclosed that applies variable test thresholds for RFID devices. The test thresholds, for example, may be determined by measuring RFID device performance in various configurations based on the operational state of neighboring RFID devices.

More specifically, in accordance with one embodiment of the present invention, an RFID device test system includes an RFID device tester adapted to test RFID devices that are disposed in a closely spaced configuration; and wherein the RFID device tester applies a variable threshold, to each of the RFID devices tested, based on a characteristic of at least one of the RFID devices neighboring the RFID device being tested.

In accordance with another embodiment of the present invention, an RFID system includes a plurality of RFID devices; and means for testing the RFID devices, wherein the testing means sets a performance threshold for each of the RFID devices based on a characteristic of at least one of the RFID devices neighboring the RFID device being tested.

In accordance with another embodiment of the present invention, a method of testing RFID devices includes communicating with a first one of the RFID devices; and determining a performance threshold for the first one of the RFID devices based on a characteristic of at least one of the RFID devices neighboring the first one of the RFID devices.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
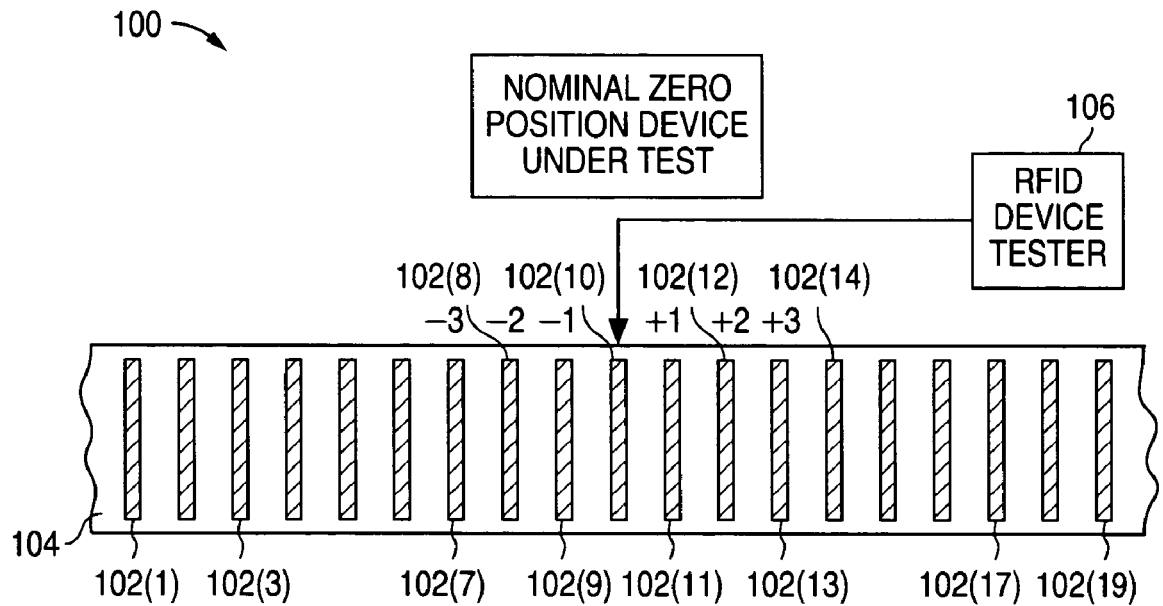
FIG. 1 shows a block diagram illustrating a test system for RFID devices in accordance with an embodiment of the present invention.

FIG. 1 shows a block diagram illustrating a test system 100 for radio frequency identification (RFID) devices in accordance with an embodiment of the present invention. System 100 includes a number of RFID devices 102, which are separately referenced as RFID devices 102 (1) through 102 (19). RFID devices 102, for example, are in close proximity to each other, and for this exemplary application may be manufactured on a carrier web 104 (e.g., a sheet or a roll format, a portion of which may be shown in FIG. 1).

RFID devices 102 may be tested during or after the manufacturing process, for example, with a RFID device tester 106. RFID device tester 106 may represent a near-field tester, a far-field tester, or some combination of near-field and far-field testers, as discussed further herein. Furthermore, RFID device tester 106 in FIG. 1 may be incorporated into a device, such as for example a printer for printing information on RFID devices 102 (e.g., RFID labels) and programming and/or testing RFID devices 102.

Because RFID devices 102 are in close proximity to each other, it has been determined that the test results for one RFID device 102 will be influenced or affected by other RFID devices 102 nearby (e.g., due to interaction of RFID devices 102). RFID devices 102 that influence or affect the test results may be adjacent to and/or in the general area of the RFID device 102 being tested, which may depend, for example, upon the application, environment, and type of RFID devices 102, including inlay pitch (i.e., spacing) and/or antenna fields.

For example, RFID device 102 (10) may be influenced during testing by adjacent RFID devices 102 (9) and 102 (11) and perhaps, to some lesser extent, by other nearby devices, such as RFID devices 102 (8) and 102 (12). Additionally, if RFID devices 102 are viewed as forming a column and if other columns are present (e.g., one or more parallel columns of RFID devices 102 (not shown) adjacent the column of RFID devices 102 shown in FIG. 1), then these additional columns of RFID devices may also influence the test results (e.g., of RFID device 102 (10)).

Furthermore, for example, the degree of influence or interaction among RFID devices 102 may depend upon their spacing relative to a wavelength of a test frequency. As an example, RFID devices 102 (9) and 102 (11) may be spaced a relatively small fraction of a wavelength from RFID device 102 (10), which may result in a relatively low interaction (e.g., a near field effect) with RFID device 102 (10) being tested. However, the relative interaction may increase for RFID devices 102 (e.g., RFID devices 102 (7) and 102 (13)) that are separated from RFID device 102 (10) by one-quarter wavelength, one-half wavelength, or other wavelength increments, due to the interactions having specific phase relationships at these distances.

RFID device tester 106 may test RFID devices 102, for example at a test position currently occupied by RFID device 102 (10) in FIG. 1, by determining its ability to communicate with RFID device tester 106 (e.g., an RFID reader) at a defined power or voltage level and frequency. Conventional test techniques would apply a certain fixed threshold for every RFID device 102, with any of RFID devices 102 failing to exceed the fixed threshold considered defective.

Thus, conventional test methods set test thresholds in a static way, which fail to account for the affect of RFID devices adjacent to the RFID device under test (e.g., in a roll format). Consequently, the conventional test methods may result in erroneous test results regarding whether the RFID device is operational (e.g., if the RFID device is good or bad) and lead to reduced quality and/or yields from the manufacturing process.

In contrast, in accordance with one or more embodiments of the present invention, RFID device test techniques are disclosed that apply a variable threshold (e.g., an adaptive threshold) to RFID devices 102. The variable threshold, for example, provides an RFID test pass/fail threshold that takes into account the characteristics of nearby RFID devices (e.g., adjacent RFID devices). Consequently, for example, the variable threshold based on adjacent RFID device test results may provide more accurate and reliable test results, which may lead to increases in quality and manufacturing yields.

As a specific example, it is assumed that RFID device 102 (10) is defective and RFID devices 102 (11) and 102 (12) are operational and tested in sequence. RFID device tester 106 tests RFID device 102 (10) and determines that it fails the test. For example, no response is received from RFID device 102 (10) and measurements of reflected power between RFID device tester 106 and RFID device 102 (10) (or a near field coupler) indicates that RFID device 102 (10) may have a defective antenna (e.g., a short circuit in the antenna due to a printing or manufacturing error).

Continuing with the example, RFID device tester 106 then tests RFID device 102 (11). If a conventional static pass/fail threshold was utilized, RFID device 102 (11) may fail the test even though it is operational and should pass the test, due to the effect or interference of the adjacent defective RFID device 102 (10). Thus, the number of apparent failures or defective RFID devices 102 may be artificially increased (e.g., by a factor of two or more), because of the effect that the defective RFID device 102 (10) has on the testing of nearby RFID devices 102 (e.g., RFID device 102 (9), 102 (11), and/or 102 (12)).

This test anomaly or defective RFID device effect or interaction also artificially makes the RFID devices being tested to appear defective in groups. Consequently, one or more of the RFID devices tested as defective may have to be removed (e.g., from the carrier web, sheet, or roll) so that these "defective" RFID devices are not presented to subsequent processing steps (e.g., a label applicator or a printer), which may lack the capability to handle more than one defective RFID device in a row.

In contrast and continuing with the example, RFID device tester 106 may test RFID device 102 (11) utilizing a variable threshold, rather than the conventional static (fixed) threshold, in accordance with an embodiment of the present invention. The test results for RFID device 102 (11) may be compared to the variable threshold (e.g., variable pass/fail threshold), which may be weighted to compensate for the known effects of the adjacent defective RFID device 102 (10). The test results for RFID device 102 (11) may also be weighted based on the results for other nearby RFID devices 102, such as RFID device 102 (12) that is an operational RFID device. Consequently, the test results of RFID device 102 (11) with the appropriate variable threshold applied (e.g., a lower pass/fail threshold due to the presence of defective RFID device 102 (10)) will indicate correctly that RFID device 102 (11) is an operational device and will pass the test (e.g., at a lower power or voltage level).

The variable threshold may be based on one or more parameters and/or on one or more different measurements in accordance with one or more embodiments of the present invention. For example, the RFID device being tested may have measurements performed at different frequencies and/or power levels with one or more variable thresholds applied. As another example, a parameter of interest may include the ratio of the coupled and reflected power of the RFID device being tested. Additionally, a camera or other optical or visual inspection system (e.g., incorporated within or separate from RFID device tester 106) may be included, which may be employed to reject the RFID devices that are clearly defective (e.g., nonexistent or damaged RFID device, such as a poorly formed antenna or missing RFID strap). This information could be utilized to form appropriate thresholds or utilized in conjunction with the thresholds.

In general, the variable threshold technique may be applied for near-field testing and/or far-field testing applications. Furthermore, the variable threshold technique may be applied by utilizing lookup tables or equations to provide the appropriate values for the variable threshold.

For example, Table 1 illustrates exemplary measurements and compensation (e.g., threshold adjustment values) for a number of RFID devices 102 of FIG. 1 (e.g., RFID devices 102 manufactured and tested in close proximity, such as the roll format). In this particular example, RFID devices 102 (7), 102 (8), 102 (9), 102 (11), and 102 (12) are operational (i.e., good) RFID devices, while RFID device 102 (10) is not operational (i.e., bad or defective). The determined read margins during testing are listed in Table 1, with RFID device 102 (10) providing an insufficient response (e.g., an x indicating no response or a clearly insufficient margin determined).

Although RFID device 102 (10) is defective, it still may affect the test results of RFID devices 102 that are nearby. For example, RFID devices 102 (9) and 102 (11) have a much lower read margin (i.e., −1) than expected due to the influence of defective RFID device 102 (10). Consequently, in accordance with an embodiment of the present invention, the test results for RFID devices 102 (9) and 102 (11) may be compensated (e.g., by 2) to account for the effect of RFID device 102 (10).

TABLE 1

| RFID DEVICE | READ MARGIN MEASURED | COMPENSATION |
|---|---|---|
| RFID DEVICE 102(7) | 2.5 | — |
| RFID DEVICE 102(8) | 3 | — |
| RFID DEVICE 102(9) | −1 | 2 |
| RFID DEVICE 102(10) | X | — |
| RFID DEVICE 102(11) | −1 | 2 |
| RFID DEVICE 102(12) | 3 | — |

The compensation values may be determined (e.g., in processing), for example in accordance with an embodiment of the present invention, and applied based on a series of test measurements (e.g., far field read margin measurements). The compensation values, for example, may be calculated for each RFID device 102 (e.g., RFID inlay) based on an adaptive threshold model. As an example, the compensation values may be determined from a lookup table developed via a model of compensation values appropriate for given RFID device configurations of "good"/"bad" measurements (e.g., read margins).

As a specific example, Table 2 illustrates three exemplary configurations for neighboring RFID devices (e.g., in the roll format) and their operational state. Table 2 may be viewed as a lookup table based on five RFID devices (labeled RFID devices 1 through 5), with qualitative "good" and "bad" values for the RFID devices in various configurations or arrangement.

TABLE 2

| Configuration | RFID DEVICE 1 | RFID DEVICE 2 | RFID DEVICE 3 | RFID DEVICE 4 | RFID DEVICE 5 |
|---|---|---|---|---|---|
| 1 | Good | Bad | Under Test | Good | Good |
| 2 | Bad | Bad | Under Test | Good | Good |
| 3 | Good | Bad | Under Test | Bad | Good |

For example, configuration 3 illustrates the exemplary configuration of two defective (i.e., "bad") RFID devices adjacent the RFID device 3 being tested. Configuration 2 illustrates the exemplary configuration of two defective RFID devices on one side, with an operational (i.e., "good") RFID device 4 on the other side of the RFID device 3 being tested. Configuration 1 illustrates the exemplary configuration of the defective RFID device 2 on one side of the RFID device 3 being tested, with the operational (i.e., "good") RFID device 4 on the other side of the RFID device 3.

In general for these configurations, the RFID device 3 in configuration 3 may require the lowest pass/fail threshold (e.g., the highest compensation value). The RFID device 3 may require a relatively higher pass/fail threshold in configuration 2 relative to configuration 3 and a relatively higher pass/fail threshold in configuration 1 relative to configuration 2. Thus, a variable threshold would be determined or set to a high value, a medium value, and a low value for configurations 1, 2, and 3, respectively.

Thus, for this exemplary implementation, a series of tests may be performed with various configurations of operational and defective RFID devices to determine an appropriate threshold level for the RFID device under test based on the status (e.g., operational or defective) of neighboring RFID devices. In general, the threshold will decrease (e.g., higher compensation value) as the number of defective RFID devices is increased in the neighborhood of the RFID device under test.

The variable threshold values determined by testing the various configurations may then be applied to the RFID devices being tested during or after the manufacturing process. Furthermore, the data from the RFID devices being tested during or after the manufacturing process may be approximated (e.g., rounded up or down) to fit the test data to an appropriate configuration in the lookup table containing various configurations of neighboring RFID device measurements. Additionally, as an alternative to the lookup table, formulas may be determined to model the various configurations, with the formulas employed to set the thresholds for the RFID devices being tested, as would be understood by one skilled in the art.

The techniques disclosed herein may be applied to any type of testing of RFID devices, which are closely spaced or are near enough to each other to influence the test results of one or more of the RFID devices. For example, the techniques may be applied to a series of closely spaced RFID inlays whose RFID inlay pitch (i.e., spacing) and/or antenna fields (e.g., physical aperture or effective area of the RFID inlay antenna field) result in test interference or influence of the test results.

As an example, an effective area "A" for an RFID inlay antenna may be calculated from the antenna gain based on equation (1) shown below. In general, for example, the variable thresholds techniques would be beneficial if adjacent or neighboring RFID inlays are within the area of influence, such as within the physical aperture of the RFID inlay's antenna.

$$\text{Antenna Gain} = \frac{4\pi A}{\lambda^2} \quad (1)$$

As discussed herein, additional parameters (e.g., data sources or measurements) may be utilized (e.g., in addition to near or far-field measurements of the RFID devices) to determine the variable threshold values. For example, as noted, an optical device may be employed to identify defective RFID devices (e.g., by sensing or recognizing manufacturing defects).

Figure 2:
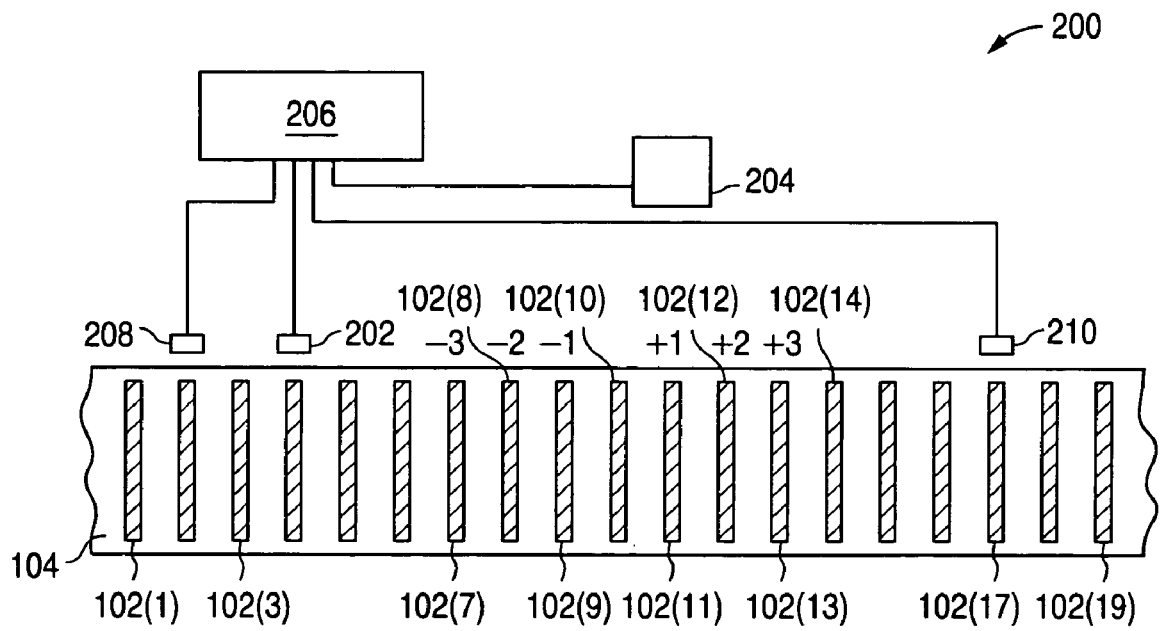
FIG. 2 shows a block diagram illustrating a test system for RFID devices in accordance with an embodiment of the present invention.

Furthermore, a combination of near and far-field measurements also may be employed to test the RFID devices and determine the variable threshold values. For example, FIG. 2 shows a block diagram of a system 200 illustrating test techniques for RFID devices in accordance with an embodiment of the present invention. System 200 includes a short-range tester 202, a long-range tester 204, and a controller 206. RFID devices 102 (e.g., on web 104) are tested by system 200 (e.g., as they travel along from left to right in FIG. 2, such as during the manufacturing process).

Controller 206 (e.g., a computer, a microcontroller, or other type of control system) controls the operation of short-range tester 202 and long-range tester 204. Short-range tester 202 may be positioned in close proximity to RFID device 102 being tested (e.g., RFID device 102 (4) as shown in FIG. 2) to test each RFID device 102 as it travels within range of short-range tester 202. RF shielding and other techniques may be implemented, as would be understood by one skilled in the art, to reduce interference or interaction of neighboring RFID devices 102 near the RFID device 102 under test by short-range tester 202.

Long-range tester 204 may be positioned some distance away from RFID devices 102 as each is tested (e.g., RFID device 102 (11) as shown in FIG. 2) to provide long-range testing of each RFID device 102 as it travels within range of long-range tester 204. Long-range tester 204 may perform, for example, a simple test (e.g., a read/no read test) and/or a more complex test (e.g., varying the power and/or frequency to determine performance of the RFID device).

Short-range tester 202 may be utilized to identify the RFID devices 102 that are defective (e.g., non-responsive), with this information utilized (e.g., by controller 206) to apply the one or more variable thresholds (e.g., compensation model) to the test results from long-range tester 204. Short-range tester 202 may also be utilized to identify the identification code or other unique information from the RFID devices 102 so that long-range tester 204 can identify and discriminate among RFID devices 102 (e.g., if more than one RFID device 102 simultaneously responds to long-range tester 204).

System 200 may also include an optical device 208 (e.g., a camera), which may be controlled by controller 206. Optical device 208 may provide information, for example, which can be used to inspect and recognize if the RFID device 102 is defective (e.g., an obvious manufacturing defect). This information may also be utilized (e.g., by controller 206) to apply the one or more variable thresholds (e.g., compensation model) to the test results from long-range tester 204.

System 200 may also include a marking device 210 (e.g., a printer), which may be controlled by controller 206. Marking device 210 may provide some type of identifying mark to the RFID devices 102 that are determined to be defective (e.g., non responsive or that fail to meet certain performance levels). The identifying mark may be a printed mark on the RFID device 102 or may provide some other visual indication, such as a scratch or a damaging indentation (e.g., a hole punched in the antenna) to the defective RFID device 102. Further details of exemplary short and long-range test techniques may be found in U.S. patent application Ser. No. 11/021,118 entitled "Method and System for Testing RFID Devices" filed Dec. 22, 2004, which is incorporated herein by reference in its entirety.

Figure 3:
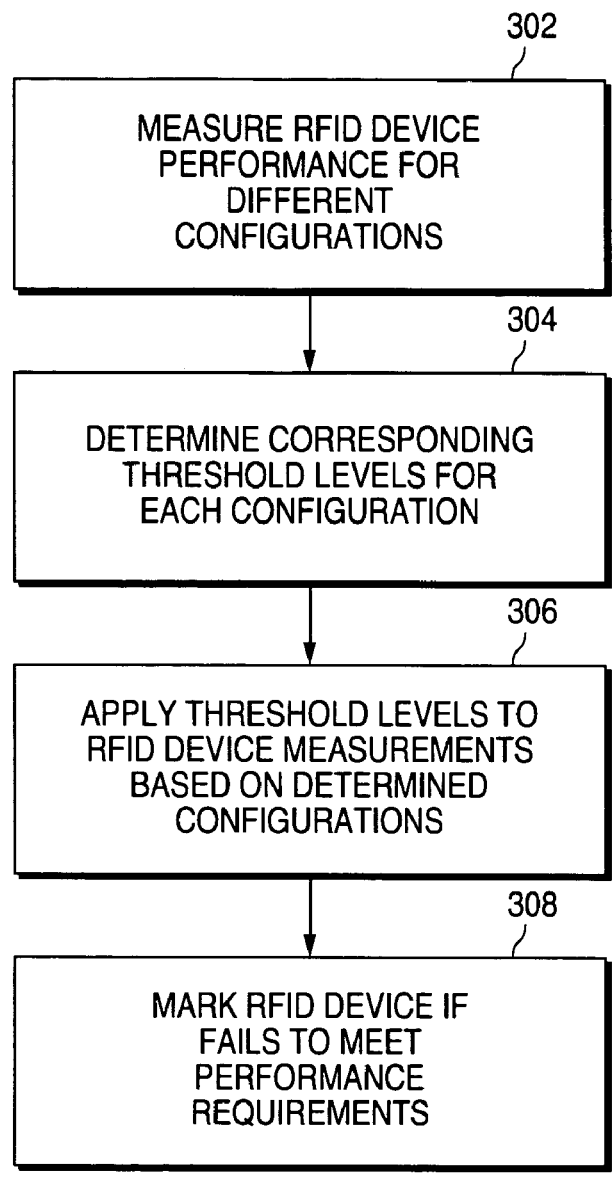
FIG. 3 shows a flowchart illustrating RFID test operations in accordance with an embodiment of the present invention.

FIG. 3 shows a flowchart illustrating general RFID test operations that may be performed in accordance with one or more embodiments of the present invention. At block 302, RFID device measurements are performed for various configurations of the RFID devices (e.g., as discussed in reference to Table 2). The threshold level (e.g., compensation value) for each configuration is then determined (block 304).

Operational testing of RFID devices (e.g., during or after manufacturing) may then utilize the threshold levels to determine whether the RFID devices meet the performance requirements, based on the determined configurations (block 306). The configuration of each RFID device being tested may be determined, for example, as discussed in reference to FIGS. 1 and/or 2. Optionally, the RFID devices that fail to meet the performance requirements may be marked (block 308).

Various short-range coupling techniques are known and may be utilized to provide the communication (e.g., RF signal) from short-range tester 202 (FIG. 2) to RFID device 102, as would be known by one skilled in the art. Additionally, communication between short-range tester 202 and RFID device 102 may be implemented as disclosed in U.S. patent application Ser. No. 10/367,515, filed Feb. 13, 2003, and entitled "RFID Device Tester and Method" and/or as disclosed in U.S. patent application Ser. No. 10/882,947, filed Jul. 1, 2004, and entitled "RFID Device Preparation System and Method," which are incorporated herein by reference in their entirety.

Figure 4:
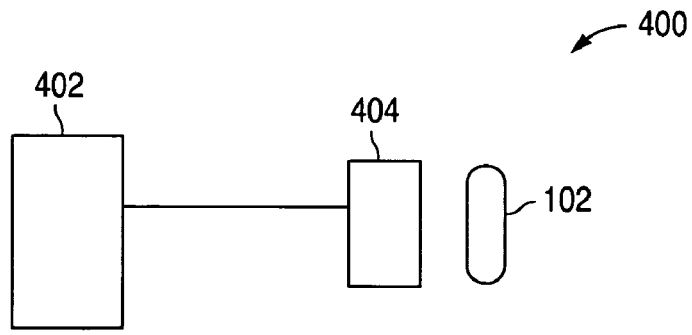
FIG. 4 shows a block diagram illustrating an RFID test system in accordance with an embodiment of the present invention.

For example, FIG. 4 illustrates an RFID test system 400 for providing short-range testing (e.g., near field coupling) in accordance with an embodiment of the present invention. RFID test system 400 includes a communication device 402, a coupler 404, and RFID device 102.

Coupler 404 may represent one or more pairs of couplers to couple via an electric field with RFID device 102 (e.g., capacitively couple to an antenna (not shown) of RFID device 102). Alternatively, or in addition, coupler 404 may represent a coil (e.g., a single-turn coil or a multi-turn coil) to couple via a magnetic field with RFID device 102 (e.g., inductively couple to the antenna of RFID device 102). Thus, coupler 404 may couple to RFID device 102 via an electric field, a magnetic field, or some combination of electric and magnetic fields (electromagnetic field), with coupler 404 providing the appropriate structure (e.g., parallel plates, single or multi-turn coils, transmission lines, or other types of structures). Furthermore, the signal frequency provided to RFID device 102 may be at a frequency different from the natural resonant frequency of RFID device 102, as discussed further in U.S. patent application Ser. Nos. 10/367,515 and 10/882,947.

Systems and methods are disclosed herein to provide test techniques for RFID devices. For example, in accordance with an embodiment of the present invention, an adaptive setting of test pass/fail thresholds for RFID devices may be implemented for a test system. The RFID devices, for example, may be closely spaced such as in a roll format, with the thresholds set based on measurements that account for the operational state of neighboring devices.

Embodiments described above illustrate but do not limit the invention. It should also be understood that numerous modifications and variations are possible in accordance with the principles of the present invention. Accordingly, the scope of the invention is defined only by the following claims.

We claim:

1. A radio frequency identification device test system comprising:
   a radio frequency identification device tester adapted to test radio frequency identification devices that are disposed in a closely spaced configuration; and
   wherein the radio frequency identification device tester applies a variable threshold, to each of the radio frequency identification devices tested, based on a characteristic of at least one of the radio frequency identification devices neighboring the radio frequency identification device being tested.

2. The radio frequency identification device test system of claim 1, wherein the radio frequency identification device tester comprises a radio frequency identification reader.

3. The radio frequency identification device test system of claim 1, wherein the radio frequency identification device tester comprises:

a short-range tester adapted to perform at least one of a read of a corresponding identification code from each of the radio frequency identification devices and a test of each of the radio frequency identification devices to determine if operational;

a long-range tester adapted to perform a test on each of the radio frequency identification devices; and a controller adapted to control the operation of the short-range tester and the long-range tester.

4. The radio frequency identification device test system of claim 3, wherein the short-range tester communicates with each of the radio frequency identification devices by at least one of an electric field and a magnetic field.

5. The radio frequency identification device test system of claim 3, wherein at least one of the short-range tester and the long-range tester communicates with each of the radio frequency identification devices at a frequency other than a natural resonant frequency of the radio frequency identification devices.

6. The radio frequency identification device test system of claim 3, further comprising a marker adapted to provide an identifying mark to each of the radio frequency identification devices that fail to meet performance requirements set by the corresponding variable threshold.

7. The radio frequency identification device test system of claim 3, further comprising an optical device adapted to perform an inspection of at least one of the radio frequency identification devices to determine if defective.

8. The radio frequency identification device test system of claim 1, wherein the variable threshold for each of the radio frequency identification devices is based on performance test data for the radio frequency identification devices in different configurations, with the neighboring radio frequency identification devices having different operational states for each of the configurations.

9. The radio frequency identification device test system of claim 1, wherein the radio frequency identification devices are disposed on at least one of a sheet of a carrier web or a roll of a carrier web.

10. A radio frequency identification system comprising;
a plurality of radio frequency identification devices; and
means for testing the radio frequency identification devices, wherein the testing means sets a performance threshold for each of the radio frequency identification devices based on a characteristic of at least one of the radio frequency identification devices neighboring the radio frequency identification device being tested.

11. The radio frequency identification system of claim 10, further comprising means for optically inspecting the radio frequency identification devices.

12. The radio frequency identification system of claim 10, further comprising means for marking the radio frequency identification devices that do not meet their corresponding performance thresholds.

13. The radio frequency identification system of claim 10, wherein the radio frequency identification devices comprise at least one of a tag, a label, a chip, a strap, and an inlay.

14. The radio frequency identification system of claim 10, wherein the performance threshold is provided from at least one of a lookup table and a formula that is based on test data of operational and defective ones of the radio frequency identification devices in various configurations.

15. The radio frequency identification system of claim 10, wherein the radio frequency identification devices are disposed on at least one of a sheet of a carrier web or a roll of a carrier web.

16. A method of testing radio frequency identification devices, the method comprising:
communicating with a first one of the radio frequency identification devices; and
determining a performance threshold for the first one of the radio frequency identification devices based on a characteristic of at least one of the radio frequency identification devices neighboring the first one of the radio frequency identification devices.

17. The method of claim 16, wherein the performance threshold is provided from at least one of a lookup table and a formula that is based on test data of operational and defective ones of the radio frequency identification devices in various configurations.

18. The method of claim 16, further comprising:
performing configuration tests for operational and defective ones of the radio frequency identification devices in various configurations; and
calculating the performance threshold for corresponding ones of the configuration tests.

19. The method of claim 16, further comprising:
applying the determined performance threshold for the first one of the radio frequency identification devices; and
marking the first one of the radio frequency identification devices as defective if its performance does not meet the determined performance threshold.

20. The method of claim 16, further comprising inspecting optically the first one of the radio frequency identification devices for defects.

* * * * *